United States Patent
Inada (10) Patent No.: US 6,584,604 B2
(45) Date of Patent: Jun. 24, 2003

(54) METHOD OF DESIGNING DRAM MACRO-CELL AND ARRANGEMENT TEMPLATE THEREFOR

(75) Inventor: Toshio Inada, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/759,511

(22) Filed: Jan. 16, 2001

(65) Prior Publication Data

US 2002/0016951 A1 Feb. 7, 2002

(30) Foreign Application Priority Data

Aug. 1, 2000 (JP) ........................................ 2000-232945

(51) Int. Cl.[7] .............................................. G06F 17/50
(52) U.S. Cl. ............................................. 716/8; 716/7
(58) Field of Search ....................... 716/1–14; 365/230

(56) References Cited

U.S. PATENT DOCUMENTS 5,883,814 A * 3/1999 Luk et al. ........................ 716/2
5,943,285 A * 8/1999 Kohno ......................... 365/230
6,002,633 A * 12/1999 Oppold et al. .............. 365/230

FOREIGN PATENT DOCUMENTS

JP 06-089937 3/1994
JP 09-167170 6/1997 ........... G06F/17/50

OTHER PUBLICATIONS

Tomoaki Yabe et al., "A Configurable DRAM Macro Design for 2112 Derivative Organizations to be Synthesized Using a Memory Generator," IEEE Journal of Solid–State Circuits, vol. 33, No. 11, Nov. 1998, pp. 1752–1757.

* cited by examiner

Primary Examiner—Matthew Smith
Assistant Examiner—Sun James Lin
(74) Attorney, Agent, or Firm—Volentine & Francos, PLLC

(57) ABSTRACT

A DRAM macro-cell designing method. The method includes a step of producing arrangement templates and a step of disposing leaf cells. In the step of producing arrangement templates, when a plurality of types of leaf cell are to be disposed to form a DRAM macro-cell, arrangement templates which are stratified into high order and low order are produced on the basis of parameters of the DRAM macro-cell such that, of the plurality of types of leaf cell, leaf cells of the same type are concatenatedly disposed. In the step of disposing leaf cells, a low-order template is employed to dispose predetermined leaf cells to produce a new leaf cell, and a high-order template is employed to dispose at least one of the new leaf cell. Consequently, it is possible to efficiently design a layout of a DRAM macro-cell without increasing a number of arrangement templates.

10 Claims, 10 Drawing Sheets

60 HIGH-ORDER DISPOSITION TEMPLATE
61 BANK LEAF CELL
62 INPUT/OUTPUT CIRCUIT PORTION LEAF CELL

F I G. 8

70 MIDDLE-ORDER DISPOSITION TEMPLATE
71 SUB-ARRAY LEAF CELL

METHOD OF DESIGNING DRAM MACRO-CELL AND ARRANGEMENT TEMPLATE THEREFOR

BACKGROUND OF THE INVENTION

The present invention relates to a method of designing a DRAM macro-cell. In particular, the present invention relates to a method of designing a DRAM macro-cell suitable for using a CAD (Computer-Aided Design) system for processing arrangement and wiring of a leaf cell that is a functional unit.

Conventionally, in generally designing a compiled macro-cell such as an SRAM or a ROM for inclusion in an ASIC (Application Specific Integrated Circuit), a leaf cell is selected so as to fit required parameter settings such as the number of words or the number of bits, and the selected leaf cell is concatenatedly disposed based on an arrangement template and laid out. An example of the arrangement template is illustrated in FIG. 7 of Japanese Patent Application Laid-Open No. 6-89937.

For connection between the leaf cells, there is employed a method of a CAD system providing automatic wiring or a method of adjacently disposing leaf cells where wires have already been formed. In addition, in Japanese Patent Application Laid-Open No. 6-89937, there is disclosed a method in which, presuming that automatic wiring will be provided by a CAD system, wiring channels in the leaf cell are provided in advance. Thus, wiring between the leaf cells is restricted in advance, which improves the efficiency (processing speed) of automatic wiring by the CAD system and improves the quality of layout data that is produced.

In the meantime, DRAM macro-cells have a plurality of types of address signals. Thus, even if macro-cells have the same number of words and number of bits a plurality of configurations are produced depending on addressing methods. There is a problem in that applying a general method of designing compiled macro-cells such as SRAMs and ROMs to a compiled DRAM macro-cell causes an increase in types of arrangement templates, an increase in number of leaf cells and an increase in scale of a circuit, which lead to extended development times and an increase in man-hours of operation and management.

SUMMARY OF THE INVENTION

The present invention has been proposed in order to solve the aforementioned problem. It is an object of the present invention to provide a method of designing a DRAM macro-cell, the method being capable of efficiently designing a layout of a macro-cell without increasing a number of arrangement templates.

According to one aspect of the present invention, there is provided a DRAM macro-cell designing method including the steps of: an arrangement template generating step of generating a plurality of arrangement templates stratified in high order and low order so that leaf cells of their same type are mainly continuous among from plural types of leaf cells that configure macro-cells; and a leaf cell disposing step of employing a low-order arrangement template, thereby disposing a predetermined leaf cell and producing a new leaf-cell, and disposing at least the new leaf cell at a high-order template, thereby designing the layout of a macro-cell.

Leaf cells are single layout units at each level of a hierarchy when a layout is provided by a CAD system. DRAM macro-cell parameters include the number of column addresses, the number of bits, the number of banks, and the number of addresses per bank. For macro-cells, plural types of leaf cells are disposed in a predetermined arrangement according to these parameters. At these arrangement templates, leaf cells of the same type are mainly disposed concatenatedly in order to efficiently perform arrangement. Here, the high-order arrangement template is a template provided at a higher level than the low-order arrangement template, irrespective of whether or not an arrangement template is present at an even higher level. Similarly, the low-order arrangement plate is a template provided at a lower level than the high-order arrangement template, irrespective of whether or not an arrangement template is present at an even lower level. At the high-order arrangement template, as well as a leaf cell newly produced by the low-order arrangement template, there may be disposed other leaf cells. In this manner, leaf cells are disposed by employing the stratified arrangement templates, whereby a design corresponding to a DRAM macro-cell configuration can be made speedily and efficiently.

In addition, in the leaf cell disposing step, the low-order arrangement template is employed, leaf cells are thereby disposed in a given direction, and a new leaf cell is produced. Then, the new leaf cell is rotated so as to correspond to the arrangement direction of the high-order arrangement templates. Thus, rotated leaf cells may be disposed in the certain direction by employing the high-order arrangement template. In this manner, leaf cells are always disposed in the given direction, and the design can be made more efficiently.

In addition, in the arrangement template producing step, an arrangement template for disposing a leaf cell which is a wiring channel is generated as the low-order arrangement template. In the leaf cell disposing step, the low-order arrangement template is employed to dispose a predetermined leaf cell and produce a new leaf cell is, and the new leaf cell is disposed by the high-order arrangement template, whereby wiring between leaf cells disposed at the high-order arrangement template may be provided.

Further, in the arrangement template producing step, there may be formed as the high-order and low-order arrangement templates, arrangement templates for disposing predetermined leaf cells and a connection wiring leaf cell for making connection between the predetermined leaf cells in a superimposed manner. As a result, wiring among all the leaf cells can be completed, and wiring connections between the leaf cells can be eliminated.

According to the present invention, there is generated a plurality of arrangement templates mainly stratified such that leaf cells of the same type are concatenated. A low-order arrangement template is employed, whereby predetermined leaf cells are disposed, and a new leaf cell is produced. And at least one new leaf cell is disposed at the high-order arrangement template, whereby the number of arrangement templates is reduced to a minimum, and a design process can be performed efficiently.

DETAILED DESCRIPTION OF THE PREFERRED EMBODIMENTS

Hereinafter, preferred embodiments of the present invention will be described in detail with reference to the accompanying drawings.

First Embodiment

Figure 1:
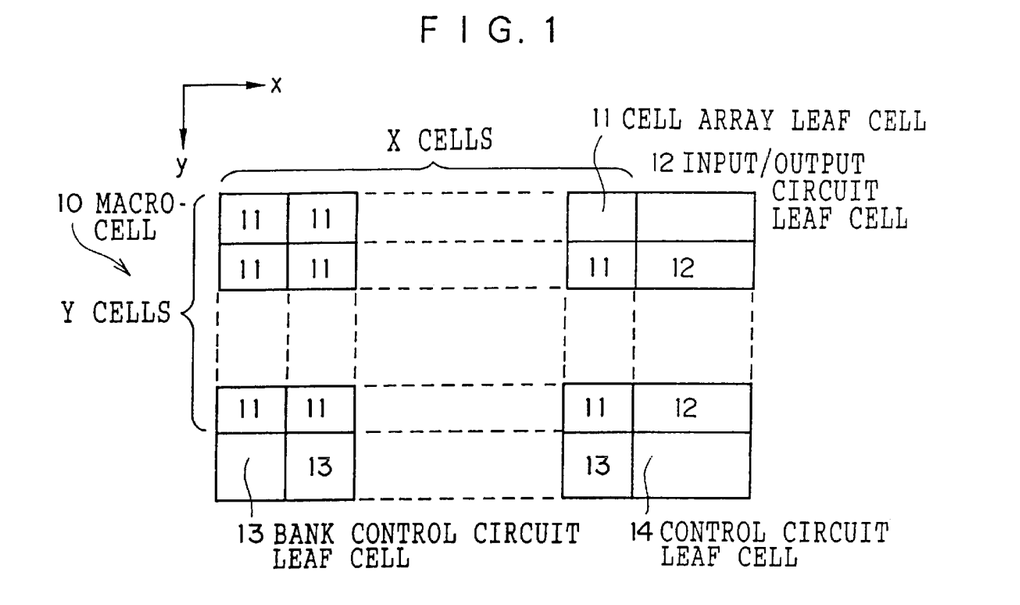
FIG. 1 is a view showing a general compiled macro-cell arrangement template.

FIG. 1 is a view showing a general arrangement template of a compiled DRAM macro-cell 10 (hereinafter, referred to as a "macro-cell"). The macro-cell 10 is repeatedly disposed in a two-dimensional manner. As shown in FIG. 1, the macro-cell is composed of four types of leaf cells, i.e., a cell array leaf cell 11, an input/output circuit leaf cell 12, a bank control circuit leaf cell 13, and a control circuit leaf cell 14.

The cell array leaf cell 11 is composed of a memory cell or a sensing amplifier and the like (not shown). The cell array leaf cells 11 are disposed in matrix form so as to form a substantial rectangle.

The input/output circuit leaf cell 12 is composed of a main amplifier (not shown), a write buffer, a data latch, an output buffer, an input buffer, and a data bus decoder. The input/output circuit leaf cells 12 are arranged along one side of the rectangle configured by the cell array leaf cells 11.

The bank control circuit leaf cell 13 is composed of a row decoder (not shown), a column decoder, and an array control timing circuit. The bank control circuit leaf cells 13 are arranged at one side of the rectangle configured by the cell array leaf cells 11, such one side being orthogonal to the arrangement direction of the input/output circuit leaf cells 12. That is, the cell array leaf cells 11 and the input/output circuit leafs cells 12 are arranged in a direction orthogonal to each other.

The control circuit leaf cell 14 is composed of a command decoder (not shown), a clock buffer, an address buffer, and an input/output control circuit. The control circuit leaf cell 14 is arranged at a position surrounded by the input/output circuit leaf cell 12 and the bank control circuit leaf cell 13.

That is, the macro-cell 10 is laid out in accordance with the aforementioned arrangement template; X cell array leaf cells 11 and bank control circuit leaf cells 13 are concatenatedly disposed in the required number of banks in a transverse direction (X-axis direction); and Y cell array leaf cells 11 and input/output leaf cells 12 are concatenatedly disposed in the required number of input/output bits in a longitudinal direction (Y-axis direction). Although the above is generally performed, each leaf cell may be replaced, and further, a variety of configurations may be provided.

In designing such macro-cells 10, deposition templates stratified in high order and in low order are employed.

Figure 2:
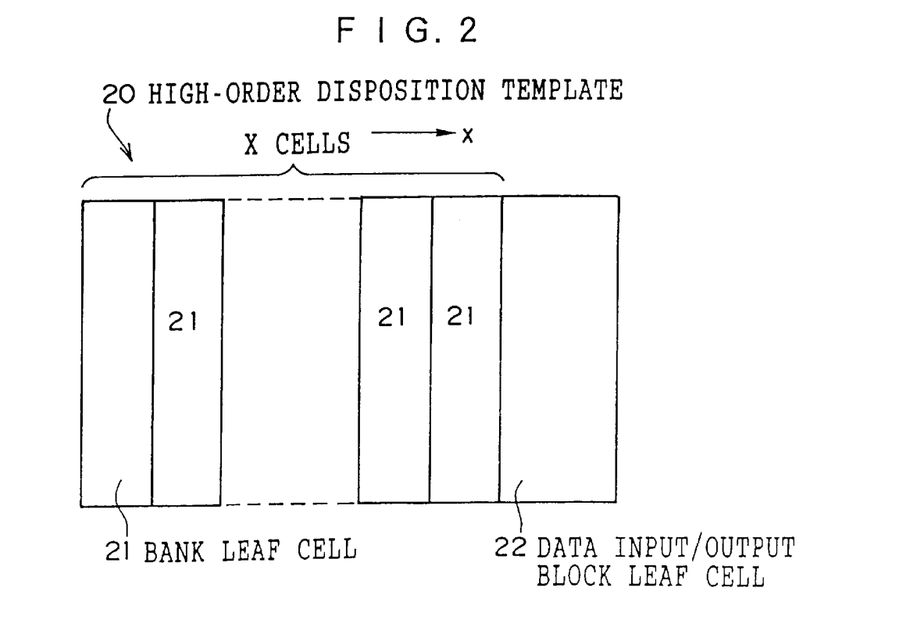
FIG. 2 is a view showing a configuration of a high-order arrangement template according to a first embodiment.

FIG. 2 is a view showing a configuration of a high-order arrangement template 20. The high-order arrangement template 20 is configured corresponding to an arrangement of bank leaf cells 21 that configures macro-cells 10 in the Y-axis direction. This template comprises X concatenatedly arranged bank leaf cells 21 and one data input/output block leaf cell 22 provided at one end in the arrangement direction of the bank leaf cells 21. Here, the high-order arrangement template 20 disposes the bank leaf cells 21 and the data input/output block leaf cell 22 in the X-axis direction.

Figure 3:
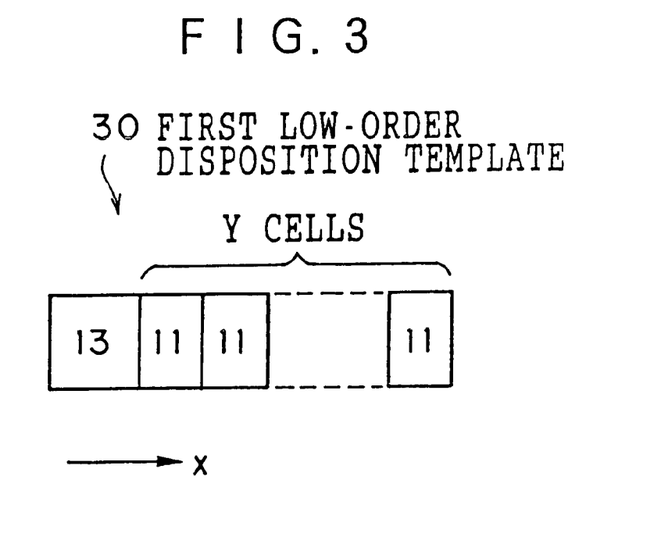
FIG. 3 is a view showing a configuration of a first low-order arrangement template that is a bank leaf cell arrangement template.

An arrangement template (hereinafter, referred to as a "first low-order arrangement template 30") for producing a bank leaf cell 21 is configured as shown in FIG. 3. The first low-order arrangement template 30 comprises Y concatenatedly arranged cell array leaf cells 11 and one bank control circuit leaf cell 13 provided at one end in the arrangement direction of the cell array leaf cells 11. The first low-order arrangement template 30 disposes the bank control circuit leaf cells 13 and the cell array leaf cell 11 in the X-axis direction.

Figure 4:
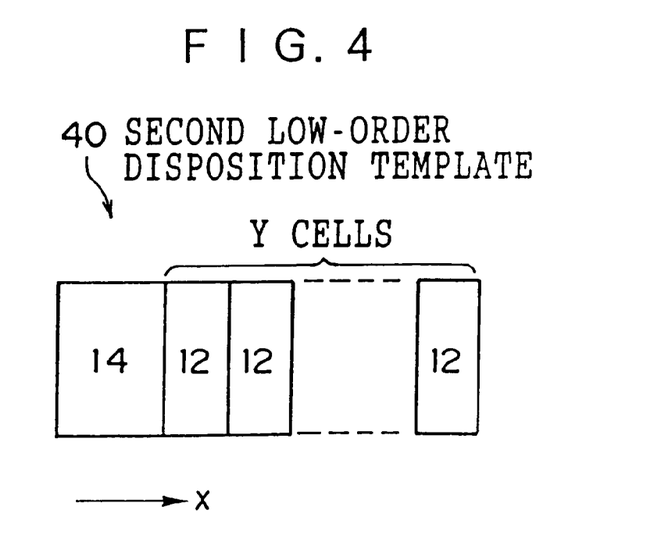
FIG. 4 is a view showing a configuration of a second low-order arrangement template that is a data input/output block leaf cell arrangement template.

In addition, an arrangement template (hereinafter, referred to as a "second low-order arrangement template 40) for generating the data input/output block leaf cell 22 is configured as shown in FIG. 4. The second low-order arrangement template 40 comprises Y concatenatedly arranged input/output circuit leaf cells 12 and one control circuit leaf cell 14 provided at one end in the arrangement direction of the input/output circuit leaf cells 12. The second low-order arrangement template 40 disposes the control circuit leaf cell 14 and the input/output circuit leaf cells 12 in the X-axis direction.

Therefore, the high-order arrangement template 20 is composed of: Y concatenatedly disposed first low-order arrangement templates 30; and a second low-order arrangement template 40 provided at one end in the arrangement direction of the first low-order arrangement templates 30.

Figure 5:
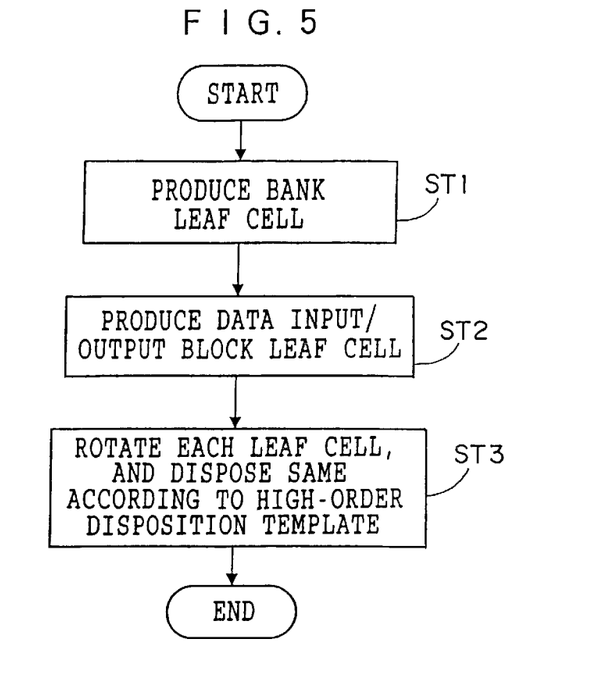
FIG. 5 is a flow chart illustrating an operation of designing a macro-cell by employing an arrangement template.

Then, the stratified arrangement templates shown in FIG. 2 to FIG. 4 are employed, whereby the layout of macro-cells 10 is designed in accordance with the processing in steps ST1 to ST3 shown in FIG. 5.

At the step ST1, a bank control circuit leaf cell 13 is disposed by employing the first low-order arrangement template 30, and further, Y cell array leaf cells 11 in number equal to the required number of input/output bits in the transverse direction (X-axis direction shown in FIG. 3) are concatenatedly disposed adjacent to the bank control circuit leaf cell 13. In this manner, a bank leaf cell 21 is produced. Then, the current step goes to the step ST2.

At the step ST2, a control circuit leaf cell 14 is disposed by employing the second low-order arrangement template 40, and further, Y input/output leaf cells 12 required in the transverse direction (X-axis direction shown in FIG. 4) are disposed adjacent to the control circuit leaf cell 14. In this manner, a data input/output block leaf cell 22 is produced. Then, the current step goes to the step ST3.

At the step ST3, the bank leaf cell 21 is rotated to the right at 270 degrees (or to the left at 90 degrees) so as to correspond to the high-order arrangement template 20, and X cells are concatenatedly disposed in the X-axis direction shown in FIG. 2. Further, a data input/output block leaf cell 22 is rotated to the right at 270 degrees (or to the left at 90 degrees), and this cell is disposed at one end in the arrangement direction of the bank leaf cells 21, whereby the layout design of the macro-cells 10 is completed.

As described above, according to the first embodiment of the present invention, arrangement templates are stratified in consideration of the arrangement direction of leaf cells configuring the macro-cell 10, and further, the bank leaf cell 21 and the data input/output block leaf cell 22 are rotated and disposed, whereby arrangement processing relevant to a required configuration is always limited to a one-dimensional direction (X-axis direction shown in FIG. 2 to FIG. 4), the configuration of the arrangement template is simplified, and arrangement processing can be performed at a high speed.

A rotation angle of a leaf cell is not limited to the present embodiment. Another angle may be set as long as such angle corresponds to the arrangement direction of the high-order arrangement template.

Second Embodiment

Now, a second embodiment of the present invention will be described here. In the present embodiment, a macro-cell is designed in consideration of a number of column addresses, a number of row addresses, a number of bits, a number of banks, and a relationship among arrangement templates, which are typical constituent parameters of a macro-cell.

Figure 6:
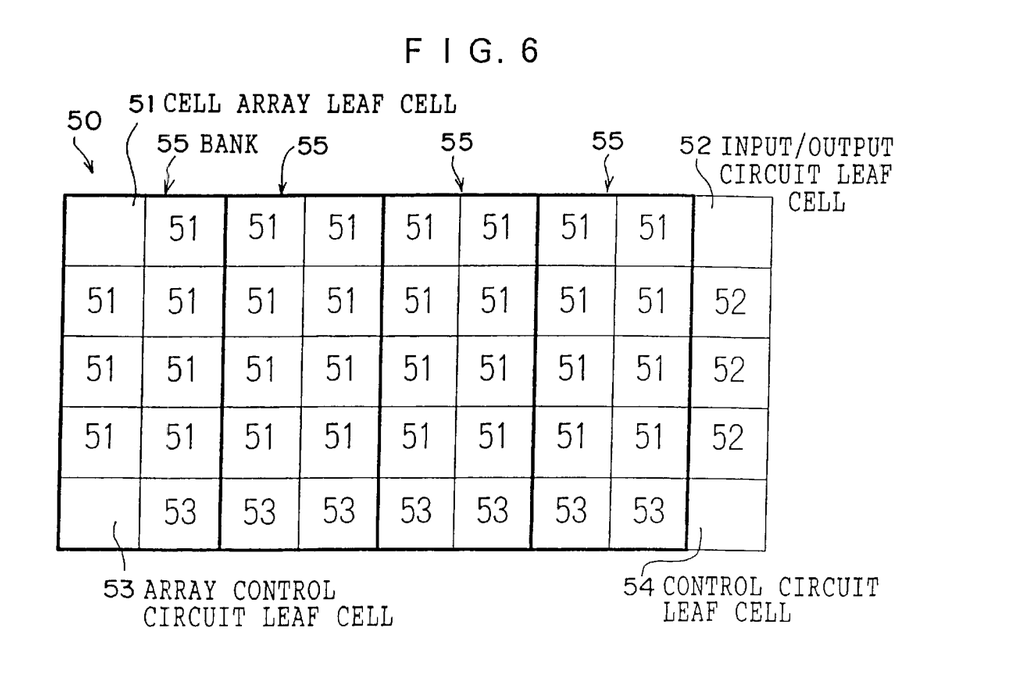
FIG. 6 is a view showing arrangement of leaf cells of the entire macro-cell.

FIG. 6 is a view showing arrangement of leaf cells of the entire macro-cell 50. The macro-cell 50 is composed of four types of leaf cells. That is, this macro-cell comprises cell array leaf cells 51, input/output circuit leaf cells 52, array control circuit leaf cells 53, and a control circuit leaf cell 54. A bank 55 is formed by eight cell array leaf cells 51 and two array control circuit leaf cells 53 (surrounded by a bold line). In FIG. 6, although four banks 55 exist, the present invention is not limited to these banks, of course.

The cell array leaf cell 51 is configured and disposed in the same way as the cell array leaf cell 11 described in the first embodiment. The input/output circuit leaf cell 52, array control circuit leaf cell 53, and control circuit leaf cell 54 are also configured and disposed in the same way as the input/output circuit leaf cell 12, bank control circuit leaf cell 13, and control circuit leaf cell 14 in the first embodiment.

In designing the macro cell 50, arrangement templates stratified in high order, middle order, and low order are employed.

Figure 7:
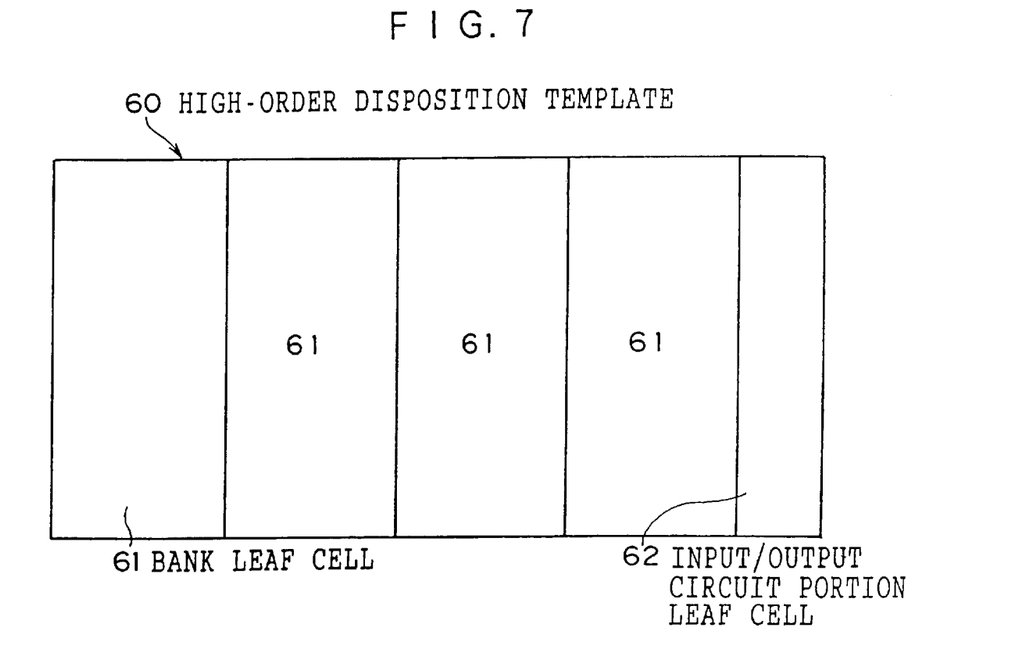
FIG. 7 is a view showing a configuration of a high-order arrangement template according to a second embodiment.

FIG. 7 is a view showing a configuration of a high-order arrangement template 60. The high-order arrangement template 60 is composed of: the bank leaf cells 61 concatenatedly disposed in number equal to that of banks 55; and one input/output circuit portion leaf cell 62 disposed at one end of the bank leaf cells 61 concatenatedly disposed.

Figure 8:
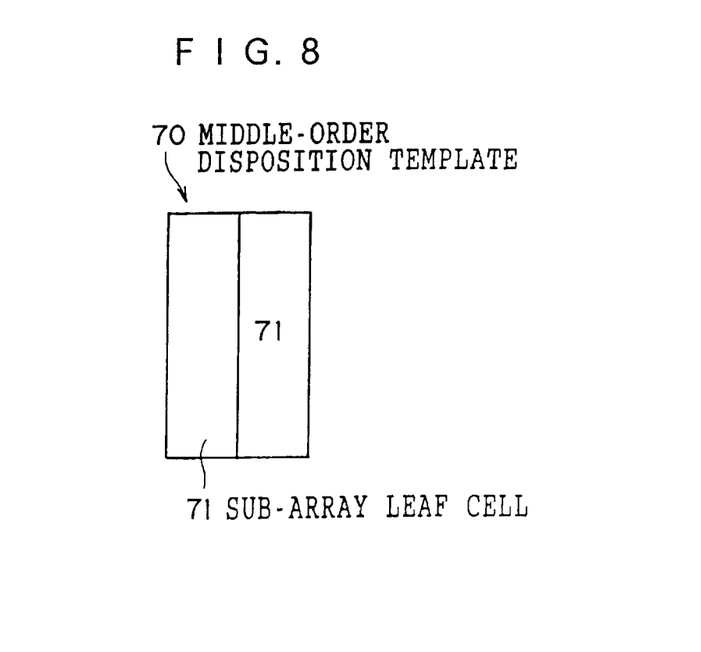
FIG. 8 is a view showing a configuration of a middle-order arrangement template that is a bank leaf cell arrangement template.

An arrangement template (hereinafter, referred to as a "middle-order arrangement template 70") for producing a bank leaf cell 61 is configured as shown in FIG. 8. The middle-order arrangement template 70 is composed of two sub-array leaf cells 71.

Figure 9:
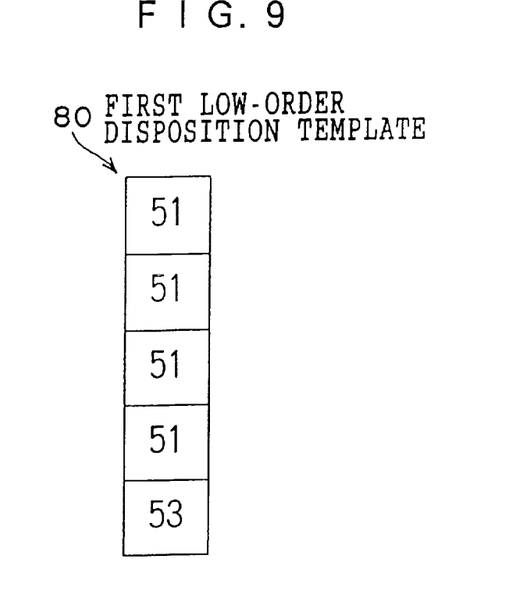
FIG. 9 is a view showing a configuration of a first low-order arrangement template that is a sub-array leaf cell arrangement template.

An arrangement template (hereinafter, referred to as a "first low-order arrangement template 80") for producing a sub-array leaf cell 71 is configured as shown in FIG. 9. The first low-order arrangement template 80 is composed of: concatenatedly disposed cell array leaf cells 51 in number proportional to a product between the number of column addresses and the number of bits; and one array control circuit leaf cell 53 disposed at one end of the concatenated cell array leaf cells 51.

Figure 10:
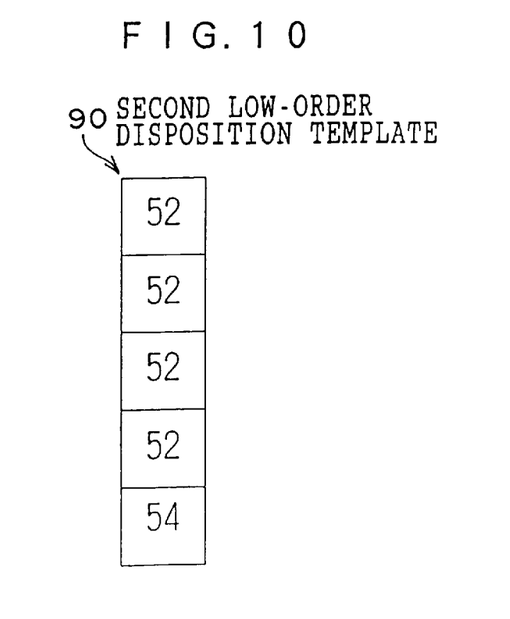
FIG. 10 is a view showing a configuration of a second low-order arrangement template that is an input/output circuit portion leaf cell arrangement template.

An arrangement template (hereinafter, referred to as a "second low-order arrangement template 90") for producing an input/output circuit portion leaf cell 62 is configured as shown in FIG. 10. The second low-order arrangement template 90 is composed of: concatenatedly disposed input/output circuit leaf cell 52 in number proportional to a product between the number of column addresses and the number of bits; and one array control circuit leaf cell 54 disposed at one end of the concatenated input/output circuit leaf cells 52.

Figure 11:
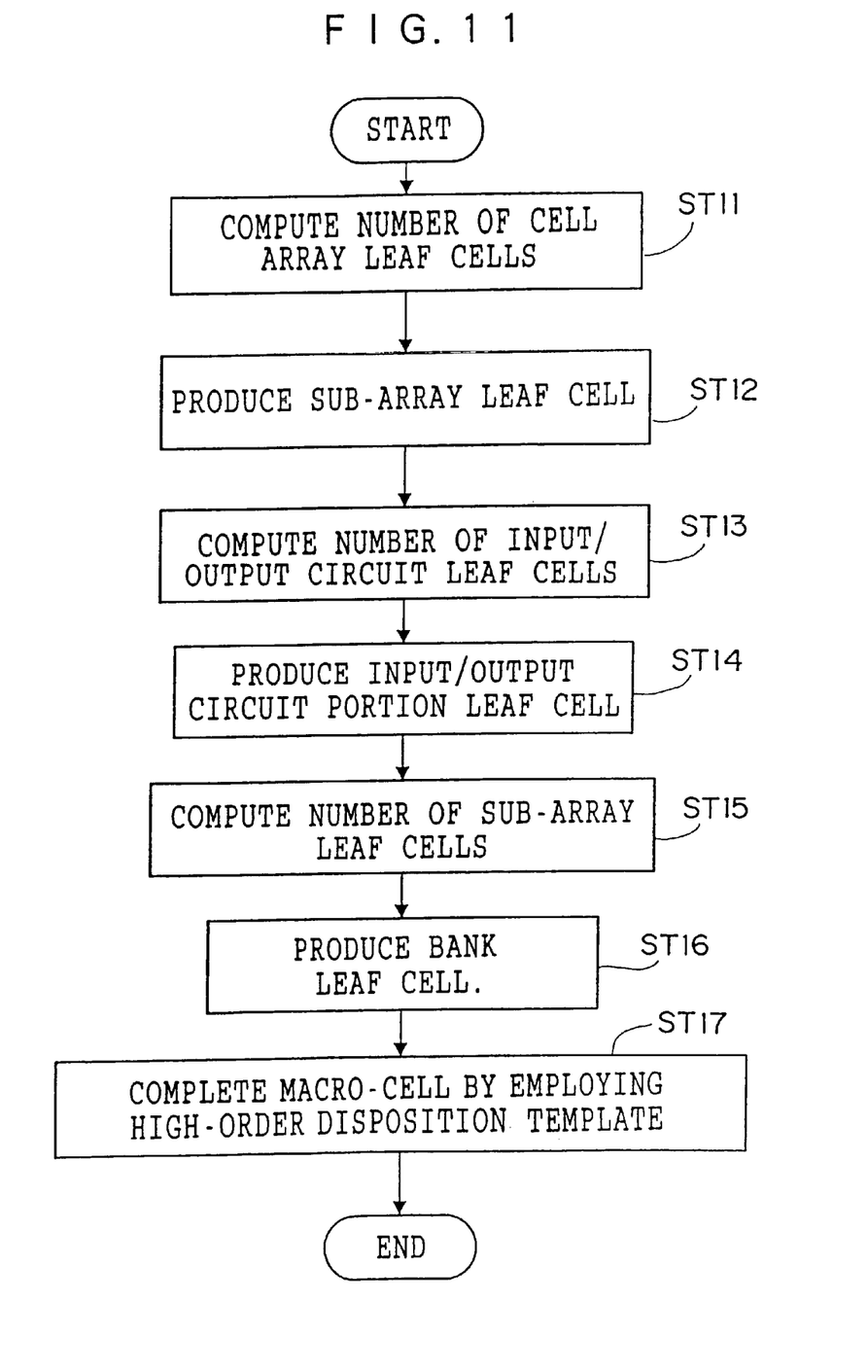
FIG. 11 is a flow chart illustrating an operation of designing a macro-cell by employing an arrangement template.

Then, the stratified arrangement templates shown in FIG. 7 to FIG. 10 are employed, whereby the layout of the macro-cell 50 is designed in accordance with the processing of the steps ST11 to ST17 shown in FIG. 11.

At the step ST11, the number of cell array leaf cells 51 disposed at a sub-array leaf cell 71 is computed from a product of the number of column addresses and the number of bits. Then, the current step goes to the step ST12.

At the step ST12, one array control circuit leaf cell 53 is disposed by using a first low-order arrangement template 80. Cell array leaf cells 51 in the number computed at the step ST11 are concatenatedly disposed adjacent to this array control circuit leaf cell 53. In this manner, the sub-array cell 71 is produced. The current step goes to the step ST13.

At the step ST13, the number of input/output circuit leaf cells 52 disposed at an input/output circuit portion leaf cell 62 is computed from a product between the number of column addresses and the number of bits. Then, the current step goes to the step ST14. The number computed at the step S11 may be employed to enable omission of this step.

At the step ST14, one control circuit leaf cell 54 is disposed by employing a second low-order arrangement template 90. input/output leaf cells 52 of the computed number are concatenatedly disposed adjacent to this control circuit leaf cell 54. In this manner, the layout of an input/output circuit portion leaf cell 62 is produced. Then, the current step goes to the step ST15.

At the step ST15, the number of sub-array leaf cells 71 disposed at a bank 55 is computed from the number of row addresses. Then, the current step goes to the step ST16.

At the step ST16, the sub-array leaf cells 71 configured at the step ST12 are concatenatedly disposed by employing a middle-order arrangement template 70. In this manner, a bank leaf cell 61 is produced. Then, the current step goes to the step ST17.

At the step ST17, one input/output circuit portion leaf cell 62 is disposed by employing a high-order arrangement template 60, and the bank leaf cells 61 in the number of banks are concatenatedly disposed adjacent to this input/output circuit portion leaf cell 62. In this manner, the layout of the macro-cell 50 is completed.

As has been described above, according to the second embodiment of the present invention, arrangement templates are stratified according to constituent parameters, whereby each arrangement template can be expressed in terms of parameters independent of another level, arrangement processing of leaf cells is simplified, and speedy processing can be performed. For addition or change of a constituent parameter or leaf cell, just an arrangement template of a predetermined hierarchy may be changed. Thus, operational and administrative man-hours for system design can be reduced.

Third Embodiment

Now, a third embodiment of the present invention will be described here. The present embodiment is related to designing the layout of compiled DRAM macro-cells in which the number of banks and the number of row addresses per bank are variable. In designing this macro-cell, arrangement templates stratified in high order, middle order, and low order are employed.

Figure 12:
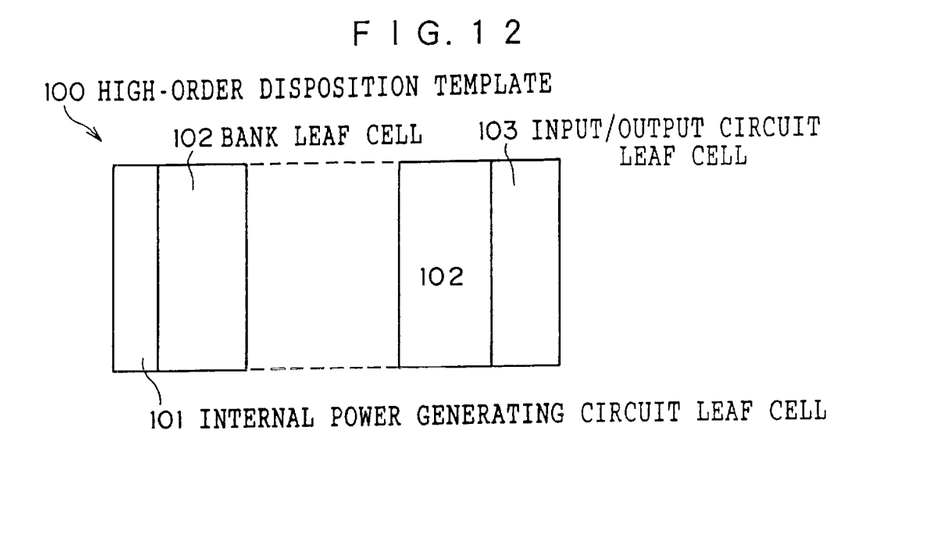
FIG. 12 is a view showing a configuration of a high-order arrangement template according to a third embodiment.

FIG. 12 is a view showing a configuration of a high-order arrangement template 100. This high-order arrangement template 100 is composed of an internal power generating circuit leaf cell 101, a bank leaf cell 102, and an input/output circuit leaf cell 103. At the high-order arrangement template 100, bank leaf cells 102 are concatenatedly disposed in predetermined number; the internal power generating circuit leaf cell 101 is provided at one end of the serial bank leaf cells 102; and the input/output leaf cell 103 is provided at the other end of the cells.

Figure 13:
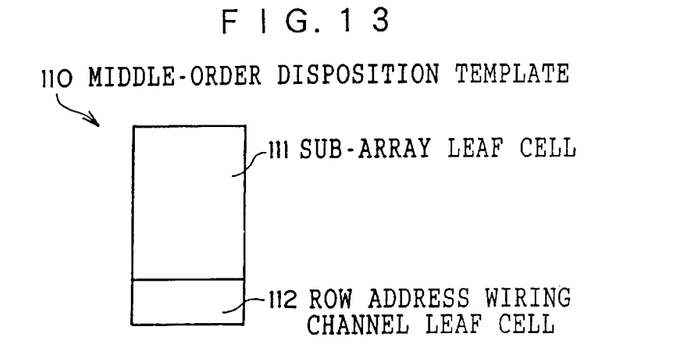
FIG. 13 is a view showing a configuration of a middle-order arrangement template that is a bank leaf cell arrangement template.

An arrangement template (hereinafter, referred to as a "middle-order arrangement template 110) for producing a bank leaf cell 102 is configured as shown in FIG. 13. The middle-order arrangement template 110 is composed of a sub-array leaf cell 111 and a row address wiring channel leaf cell 112. The row address wiring channel leaf cell 112 is composed of only a wiring layout that penetrates both ends of the leaf cell.

Figure 14:
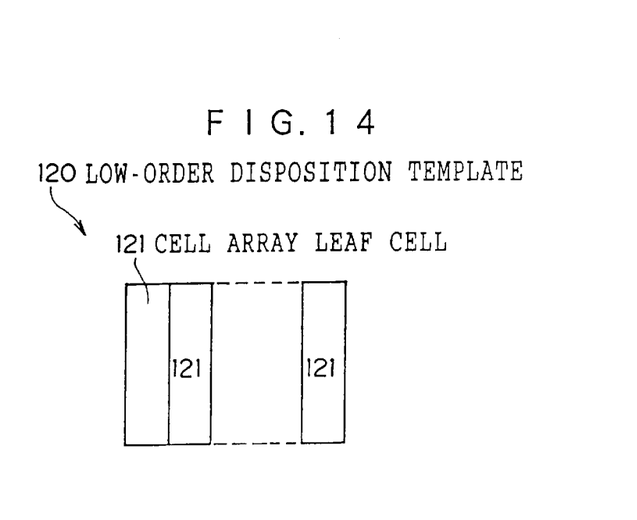
FIG. 14 is a view showing a configuration of a low-order arrangement template that is a sub-array leaf cell arrangement template.

An arrangement template (hereinafter, referred to as a "low-order arrangement template 120") for producing a sub-array leaf cell 111 is configured as shown in FIG. 14. The low-order arrangement template 120 is composed of a plurality of cell array leaf cells 121. The cell array leaf cell 121 is composed of a memory cell (not shown), a sensing amplifier, a row decoder, a column decoder, and an array control timing circuit.

In an actual compiled DRAM macro-cell, the cell array leaf cells 121, an internal power generating circuit leaf cell 101, and an input/output circuit leaf cell 103 each comprise an arrangement template, and further, a variety of configurations is present. A description of the above template and configurations will be omitted here. In addition, wiring other than bank control signal and bank selection signal wiring is not changed in consideration of change in the number of banks and the number of row addresses. A connection of the other signal wiring can be completed by adjacently disposing leaf cells.

Figure 15:
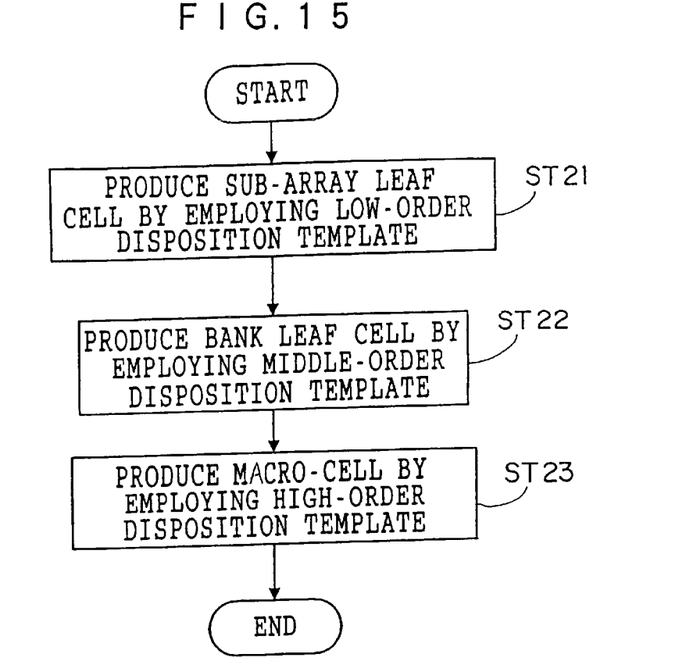
FIG. 15 is a flow chart illustrating an operation of designing a macro-cell by employing an arrangement template.

Then, the layout of the macro-cell is designed in accordance of the processing in steps ST21 to ST23 shown in FIG. 15 by employing the stratified arrangement templates shown in FIG. 12 to FIG. 14.

At the step ST21, cell array leaf cells 121 in a number that meets the required number of row addresses are disposed by employing a low-order arrangement template 120. In this manner, a sub array leaf cell 111 is produced. Then, the current step goes to the step ST22.

At the step ST22, the produced sub array leaf cells 111 and row address wiring channel leaf cells 112 corresponding to the number of row addresses are selectively disposed by employing the middle-order arrangement template 110. In this manner, a bank leaf cell 102 is produced. Then, the current step goes to the step ST23.

At the step ST23, the internal power generating circuit leaf cell 101, bank leaf cells 102 in a number that meets the required number of banks, and an input/output circuit leaf cell 103 are disposed by employing the high-order arrangement template 100. Then, these leaf cells are wired to each other, and the layout of the macro-cell is completed.

As has been described above, according to the third embodiment of the present invention, a row address wiring channel is represented as a leaf cell (row address wiring channel leaf cell 112) on a low-order hierarchy arrangement template, and the bank leaf cells 102 are produced, whereby the row address wiring of each bank can be formed in the same way overall. In this manner, a wiring delay such as reduction of a skew of a row address signal between row decoders can be controlled more easily than a case in which row address wiring is provided at a high-order level.

In addition, the bank leaf cells 102 are disposed adjacently, thereby making it possible to connect row address wiring channels. Thus, row address wiring is eliminated, and the processing speed of wiring between leaf cells at the highest level can be improved.

Further, row address wiring channel leaf cells are changed according to the number of row addresses, thereby making it possible to change the number of row address wires. In this manner, in comparison with a method of providing a row address wiring channel in advance at the cell array leaf cells 121 including row decoders based on the maximum number of row addresses, unnecessary wiring channels are prevented from being produced, and the layout of the macro-cell can be miniaturized.

Fourth Embodiment

Now, a fourth embodiment of the present invention will be described here. In the present embodiment, in designing a compiled DRAM macro-cell in which the number of banks and the number of row addresses per bank are variable, there is employed an arrangement template that differs from that shown in the third embodiment.

Figure 16:
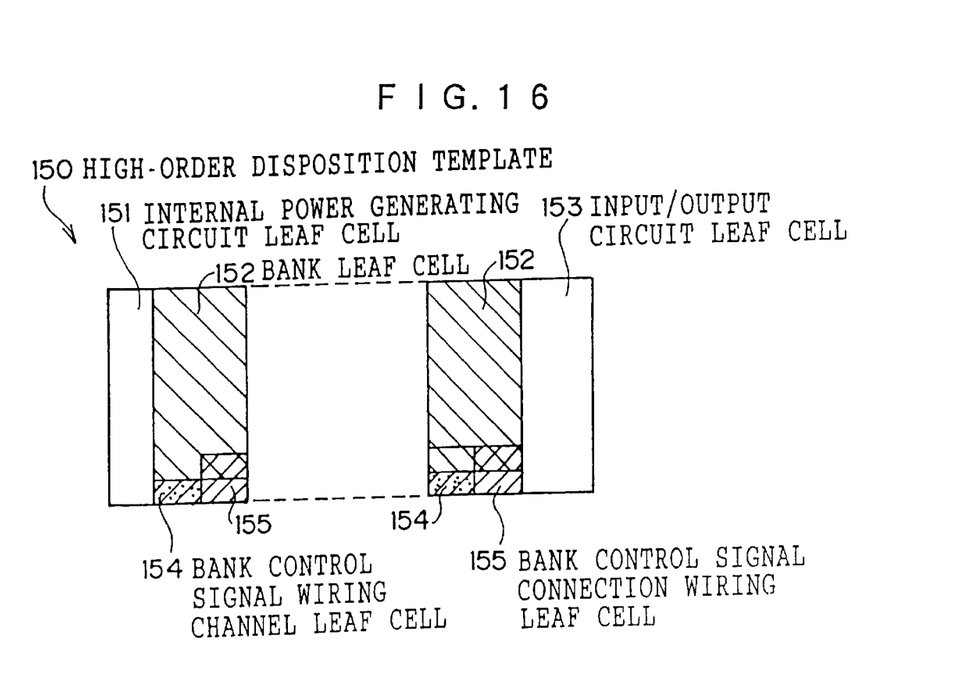
FIG. 16 is a view showing a configuration of a high-order arrangement template according to a fourth embodiment.

FIG. 16 is a view showing a configuration of a high-order arrangement template 150. The high-order arrangement template 150 is composed of an internal power generating circuit leaf cell 151, a bank leaf cell 152, an input/output leaf cell 153, a bank control signal wiring channel leaf cell 154, and a bank control signal connection wiring leaf cell 155.

The bank control signal wiring channel leaf cell 154 provides its layout such that a bank control signal and a bank selection signal are wired to penetrate both ends of the leaf cell. The width of the leaf cell is configured in the same way as a cell array leaf cell 171 which will be described later. The bank control signal connection wiring leaf cell 155 is wired to connection between the bank leaf cell 152 and the bank control signal wiring channel leaf cell 154.

In the high-order arrangement template 150, a plurality of the bank leaf cells 152 is concatenatedly disposed. The bank control signal channel leaf cells 154 are arranged adjacently at one side parallel to the arrangement direction of each bank leaf cell 152. The bank control signal connection wiring leaf cell 155 is formed in a substantial L shape, and is disposed to overlap the entire bank signal wiring channel leaf cell 154 and a part of the bank leaf cell 152.

At one end of the arrangement direction of the concatenatedly arranged bank leaf cells 152, the internal power generating circuit leaf cell 151 is arranged so as to be adjacent to the bank control signal wiring channel leaf cell

154. At the other end of the above arrangement direction, the input/output circuit leaf cell 153 is arranged so as to be adjacent to the bank control signal connection wiring leaf cell 155. In this manner, the high-order template 150 comprises the bank control signal wiring channel leaf cell 154 and bank control signal connection wiring leaf cell 155 that are required for wiring between the leaf cells.

Figure 17:
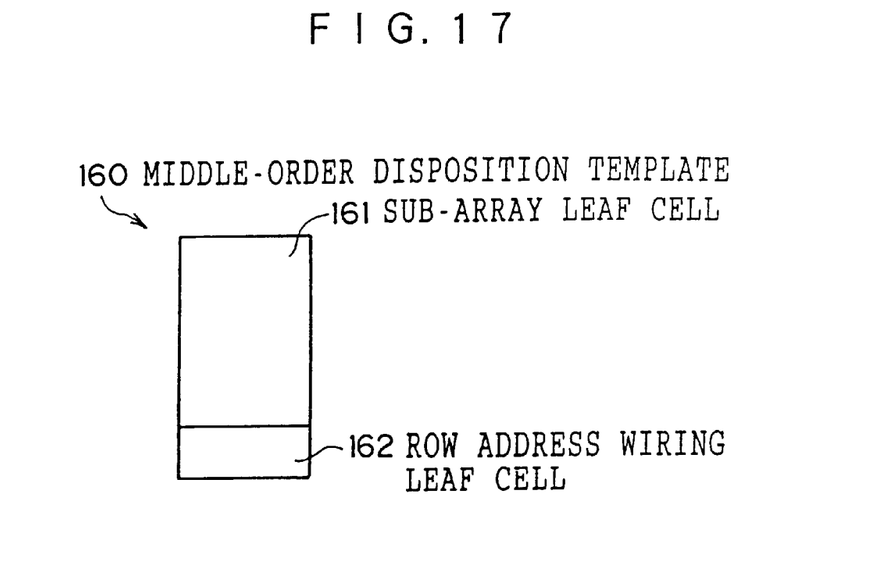
FIG. 17 is a view showing a configuration of a middle-order arrangement template that is a bank leaf cell arrangement template.

An arrangement template (hereinafter, referred to as a "middle-order arrangement template 160") for producing a bank leaf cell 152 is configured as shown in FIG. 17. The middle-order arrangement template 160 is composed of a sub-array leaf cell 161 and a row address wiring leaf cell 162. That is, the middle-order arrangement template 160 comprises the row address wiring leaf cell 162 required for wiring between the leaf cells at this hierarchy.

Figure 18:
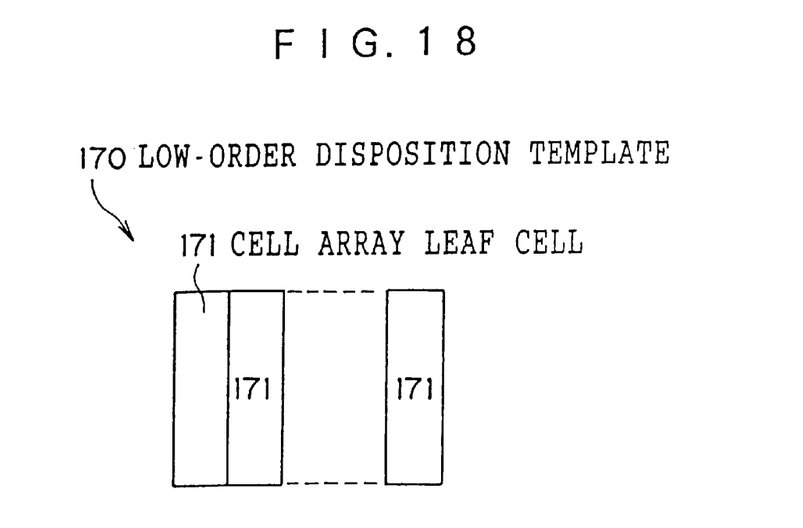
FIG. 18 is a view showing a configuration of a low-order arrangement template that is a sub-array leaf cell arrangement template.

An arrangement template (hereinafter, referred to as a "low-order arrangement template 170") for producing a sub-array leaf cell 161 is configured as shown in FIG. 18. The low-order arrangement template 170 is composed of a plurality of cell array leaf cells 171.

In an actual compiled DRAM macro-cell, the cell array leaf cell 171, internal power generating circuit leaf cell 151, and input/output circuit leaf cell 153 provide arrangement templates, and further, a variety of configurations are present. A description of the above templates and configurations will be omitted here. In addition, wiring other than bank control signal and bank selection signal wiring is not changed in consideration of a change in the number of banks and the number of row addresses, and leaf cells are disposed adjacently, whereby the other signal wiring connections can be completed.

Figure 19:
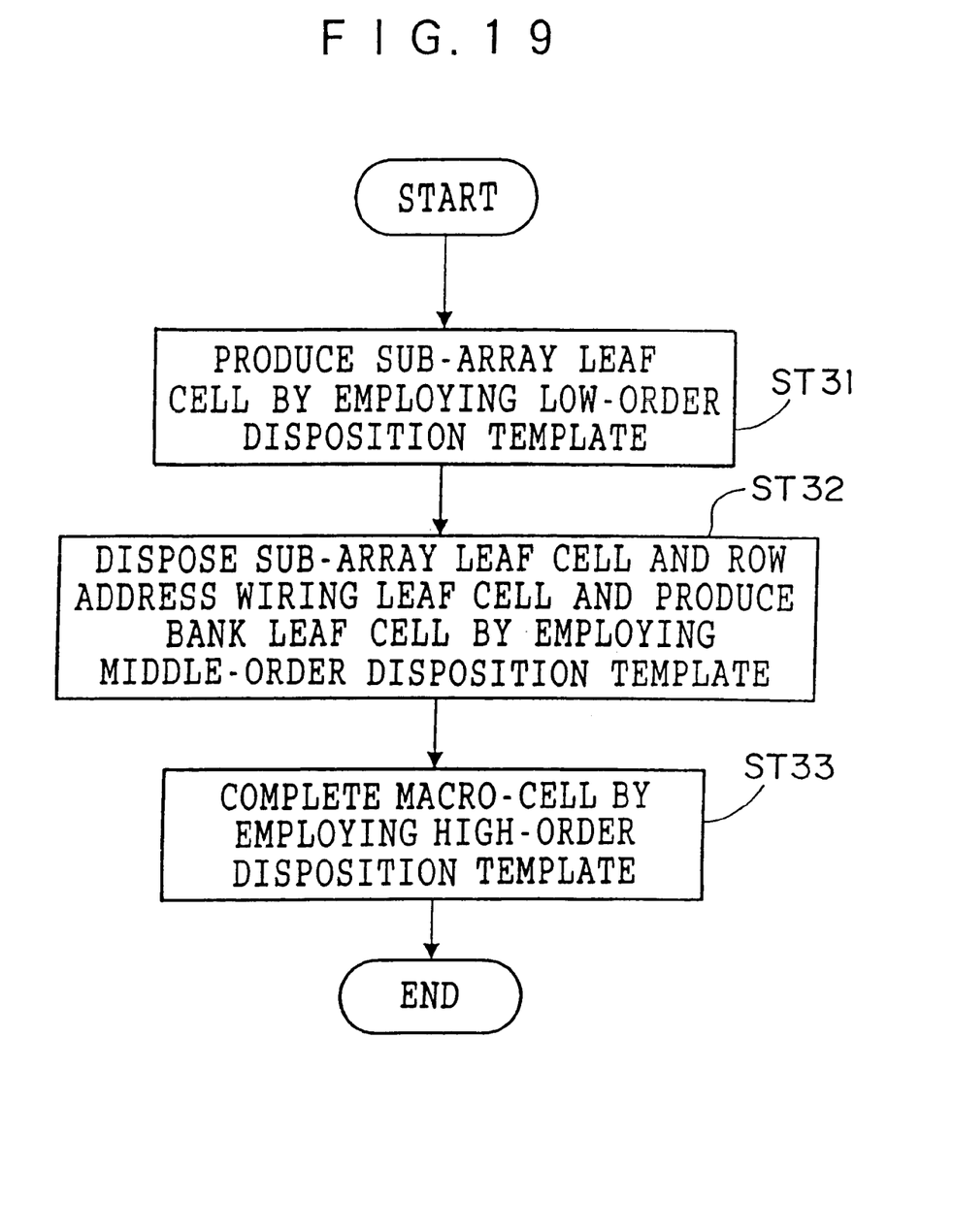
FIG. 19 is a flow chart illustrating an operation of designing a macro-cell by employing an arrangement template.

Then, the stratified arrangement templates shown in FIG. 16 to FIG. 18 are employed, whereby the macro-cells are designed in accordance with the processing of the steps ST31 to ST33 shown in FIG. 19.

At the step ST31, cell array leaf cells 171 in a number that meets the required number of row addresses are disposed by employing the low-order arrangement template 170. In this manner, the sub-array leaf cell 161 is produced. Then, the current step goes to the step ST32.

At the step ST32, the sub-array leaf cell 161 produced at the step ST31 and the row address wiring leaf cells 162 corresponding to the number of row addresses are selectively disposed by employing the middle-order arrangement template 160. At this time, the sub-array leaf cell 161 and the row address wiring leaf cell 162 are disposed to overlap each other, and row address wiring is completed. In this manner, the bank leaf cell 152 is produced. Then, the current step goes to the step ST33.

At the step ST33, the macro-cell is completed by employing the high-order arrangement template 150. Specifically, the internal power generating circuit leaf cell 151, bank leaf cells 152 according to the number of banks, and an input/output circuit leaf cell 153 are disposed based on the high-order arrangement template 150. Further, the bank control signal wiring channel leaf cells 154 are disposed adjacently by each bank leaf cell 152. In addition, the bank control signal connection wiring leaf cell 155 corresponding to each bank is disposed to overlap the bank leaf cell 152 in the width of the bank. Then, the wiring of each of the bank control signal and bank selection signal is completed, and the layout of the macro-cell is completed.

As has been described above, according to the fourth embodiment of the present invention, at an arrangement template of a level required for wiring, there are provided a row address wiring leaf cell 162, a bank control signal wiring leaf cell 154, and a bank control signal connection wiring leaf cell 155 as well as a general leaf cell. Therefore, the layout is produced by employing these leaf cells, thereby making it possible to eliminate any wiring procedure. Further, the wiring length or wiring sequence that influences the performance of the macro-cell can be controlled at a stage at which a wiring leaf is produced, and higher quality macro-cell can be designed.

In the fourth embodiment, although the designing of the macro-cell layout without wiring means has been described, a net list is outputted from connection between the macro-cells produced by a wiring leaf cell, and is combined with a leaf cell network list, whereby the macro-cell net list can be produced.

What is claimed is:

1. A method of designing a DRAM macro-cell in which a plurality of types of leaf cell are disposed to form the DRAM macro-cell, the method comprising:

(a) an arrangement template producing step in which arrangement templates stratified into a high order and a low order are produced on the basis of a parameter of the DRAM macro-cell, such that leaf cells of the same type are concatenatedly disposed at one of the arrangement templates; and (b) a leaf cell disposing step in which a low-order arrangement template is employed to dispose predetermined leaf cells in one dimension to produce a new leaf cell, and a high-order arrangement template is employed to dispose the new leaf cell.

2. The method according to claim 1, wherein parameters of the DRAM macro-cell include a number of column addresses, a number of bits, a number of banks, and a number of addresses per bank.

3. The method according to claim 1, wherein the leaf cell disposing step includes the sub-steps of:

(1) disposing the leaf cells along said one dimension by employing the low-order arrangement template, thereby producing the new leaf cell;

(2) rotating the new leaf cell in accordance with an arrangement direction of the high-order arrangement template: and (3) disposing the new leaf cell along the given direction by employing the high-order arrangement template.

4. The method according to claim 3, wherein a rotation angle of the new leaf cell is 90 degrees.

5. The method according to claim 1, wherein the arrangement template producing step includes the sub-steps of:

(1) producing, as the high-order arrangement template, a template in which the macro-cells is divided into banks; and (2) producing, as the low-order arrangement template, a template for disposing the leaf cells to form one of the bank.

6. The method according to claim 1, wherein the arrangement template producing step includes producing, as the low-order arrangement template, an arrangement template for disposing the predetermined leaf cells and a wiring leaf cell that is a wiring channel, and the leaf cell disposing step includes: disposing the predetermined leaf cells and the wiring leaf cell by employing the low-order arrangement template, thereby producing the new leaf cell; and disposing the new leaf cell by employing the high-order arrangement template, thereby providing wiring between the predetermined leaf cells disposed by the high-order arrangement template.

7. The method according to claim 1, wherein the arrangement template producing step includes forming at least one of the high-order arrangement template and the low-order arrangement template, which at least one arrangement template is for superposedly disposing the predetermined leaf cells and a connection wiring leaf cell that connects between the predetermined leaf cells.

8. An arrangement template which is stratified and which indicates a layout of a plurality of types of leaf cell, which leaf cells form a DRAM macro-cell, the arrangement template comprising:

at least one high-order arrangement template; and at least one low-order arrangement template, wherein one of the high-order arrangement template and the low-order arrangement template indicates a leaf cell layout in which leaf cells of the same type are concatenatedly disposed.

9. The arrangement template according to claim 8, wherein the leaf cell layout at the arrangement template is determined based on parameters of the DRAM macro-cell, and the parameters include a number of column addresses, a number of bits, a number of banks, and a number of addresses per bank.

10. The arrangement template according to claim 9, wherein a layout of leaf cells at the at least one high-order arrangement template is composed of a plurality of concatenated bank leaf cells, which are equal in number to the number of banks, and a single data input/output block leaf cell provided at an end portion of an arrangement direction of the bank leaf cells, a leaf cell layout of a first low-order arrangement template, which indicates a layout of the bank leaf cells, is composed of a plurality of concatenated cell array leaf cells, which are equal in number to the number of bits, and a single bank control circuit leaf cell provided at an end portion of an arrangement direction of the cell array leaf cells, and a leaf cell layout of a second low-order arrangement template, which indicates a layout of the data input/output block leaf cell, is composed of a plurality of input/output circuit leaf cells, which are equal in number to the number of bits, and a single control circuit leaf cell provided at an end portion of an arrangement direction of the input/output circuit leaf cells.

\* \* \* \* \*